United States Patent
Abe et al.

(10) Patent No.: US 9,203,313 B2
(45) Date of Patent: Dec. 1, 2015

(54) COMPLEX POWER MANAGEMENT DEVICE AND COMMUNICATION DEVICE

(71) Applicant: TDK Corporation, Tokyo (JP)

(72) Inventors: Toshiyuki Abe, Tokyo (JP); Hironori Chiba, Tokyo (JP); Mikihiro Kumon, Tokyo (JP); Hiroshi Tuji, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/273,467

(22) Filed: May 8, 2014

(65) Prior Publication Data

US 2014/0333274 A1 Nov. 13, 2014

(30) Foreign Application Priority Data

May 10, 2013 (JP) .................................. 2013-100005

(51) Int. Cl.
*G05F 1/00* (2006.01)
*H02M 3/158* (2006.01)
*H02M 1/32* (2007.01)
*H02H 7/12* (2006.01)

(52) U.S. Cl.
CPC ................ *H02M 3/158* (2013.01); *H02H 7/12* (2013.01); *H02M 1/32* (2013.01)

(58) Field of Classification Search
CPC ........... H02M 3/158; H02M 1/32; H02H 7/12
USPC ......... 323/222, 224, 225, 267, 271, 272, 282, 323/283, 284, 285, 311; 363/16, 17, 21.01, 363/21.03, 21.06, 21.1, 21.14, 21.17, 89
See application file for complete search history.

(56) References Cited

U.S. PATENT DOCUMENTS

| | | | |
|---|---|---|---|
| 2013/0049730 A1* | 2/2013 | Kato | 323/355 |
| 2013/0181221 A1* | 7/2013 | KANEKO et al. | 257/57 |
| 2014/0110155 A1* | 4/2014 | OTSUBO et al. | 174/251 |

FOREIGN PATENT DOCUMENTS

JP 4953034 10/2011

* cited by examiner

*Primary Examiner* — Gary L Laxton
*Assistant Examiner* — Afework Demisse
(74) *Attorney, Agent, or Firm* — Young Law Firm, P.C.

(57) ABSTRACT

A complex power management device includes DC/DC converters and a common reference line connected in common to the DC/DC converters. Each of the DC/DC converters includes a first switch element and inductor connected in series between first and second nodes, a second switch element, one end of which is connected to a third node that is a connection point of the first switch element and the inductor and the other end of which is connected to the corresponding ground terminal, and an output voltage adjustment circuit, which exclusively controls an ON/OFF state of the first and second switch elements based on a voltage of a fourth node that is the other end of the second switch element. The common reference line is connected to a fifth node that is provided on a wire connecting the second switch element of each of the DC/DC converters to the ground terminal.

9 Claims, 6 Drawing Sheets

COMPLEX POWER MANAGEMENT DEVICE AND COMMUNICATION DEVICE

BACKGROUND OF THE INVENTION

1. Field of the Invention

The present invention relates to a complex power management device and a communication device, and particularly to a complex power management device having a structure in which a plurality of non-isolated step-down (or step-up) DC/DC converters are integrated within one electronic-component built-in substrate, and a communication device having such a complex power management device.

2. Description of Related Art

In communication devices such as smartphones that have become rapidly popular in recent years, a power-supply voltage that is supplied from outside is stepped down, or stepped up, before being supplied to an internal processor. Therefore, non-isolated DC/DC converters are used. The non-isolated DC/DC converters use switching of transistors to convert the voltage, and are therefore suitable for making the devices smaller in size because the converters do not use transformers. In recent years, an electronic-component built-in substrate that contains such non-isolated DC/DC converters has been increasingly used. What is disclosed in Japanese Patent No. 4953034 is an example of an electronic-component built-in substrate that contains a step-down DC/DC converter.

Some of the latest communication devices such as smartphones contain a plurality of components, such as baseband processors and application processors, that require different levels of power-supply voltage. In this case, what is required is a mechanism for generating a plurality of levels of power-supply voltage from a single power-supply voltage. As a concrete example, in recent years, a study of a complex power management device that has a structure in which a plurality of non-isolated DC/DC converters are integrated in one electronic-component built-in substrate has been under way.

However, if a plurality of non-isolated DC/DC converters are integrated in one electronic-component built-in substrate, an error in a step-down or step-up operation becomes larger compared with the case where only one non-isolated DC/DC converter is incorporated. Therefore, an improvement needs to be made. Hereinafter, this point will be described in detail.

FIG. 6A is a diagram showing a non-isolated step-down DC/DC converter 100 according to background art of the present invention; FIG. 6B is a diagram showing a non-isolated step-up DC/DC converter 110 according to background art of the present invention. FIG. 6A also shows a DC power supply 120, and a load 121 to which a stepped-down power-supply voltage is supplied. FIG. 6B also shows a DC power supply 120, and a load 122 to which a stepped-up power-supply voltage is supplied. First, the configurations of those components will be described. Then, problems with the case where a plurality of non-isolated DC/DC converters are integrated in one electronic-component built-in substrate will be described.

As shown in FIG. 6A, the step-down DC/DC converter 100 includes a switch element 101, which is a P-channel MOS transistor; a switch element 102, which is a N-channel MOS transistor; a choke coil 103; an error amplifier 104; a reference voltage generation circuit 105; a variable resistor 106; a resistor 107; a ramp wave generation circuit 108; and a comparator 109. To an input node n100 of the step-down DC/DC converter 100, a DC power supply 120 is connected. To an output node n101, a load 121 is connected.

The switch element 101 and the choke coil 103 are connected in series in this order between the input node n100 and the output node n101. The switch element 102 is connected between a node n102, which is a connection point of the switch element 101 and choke coil 103, and a ground terminal. The resistor 107 and the variable resistor 106 are connected in series in this order between the output node n101 and a node n103, which is a ground-side end of the switch element 102.

Gate electrodes of the switch elements 101 and 102 are connected to an output terminal of the comparator 109. A non-inverting input terminal of the comparator 109 is connected to an output terminal of the ramp wave generation circuit 108. An inverting input terminal of the comparator 109 is connected to an output terminal of the error amplifier 104. A non-inverting input terminal of the error amplifier 104 is connected to the reference voltage generation circuit 105. An inverting input terminal of the error amplifier 104 is connected to a node n104, which is a connection point of the resistor 107 and the variable resistor 106.

In the step-down DC/DC converter 100, under the control of the error amplifier 104, the state of the switch elements 101 and 102 is switched. More specifically, between a first state in which the switch elements 101 and 102 are ON and OFF, respectively, and a second state in which the switch elements 101 and 102 are OFF and ON, respectively, the state of the switch elements 101 and 102 is switched. In the first state, the power-supply voltage is supplied along a route R101 from the DC power supply 120 to the load 121, and energy is accumulated in the choke coil 103. In the second state, a voltage is generated from the energy released from the choke coil 103, and the voltage is supplied along a route R102 to the load 121.

The error amplifier 104 outputs a value obtained by integrating the difference between the voltage of the node n104 and an output voltage of the reference voltage generation circuit 105. If the integration value is larger than the output voltage of the ramp wave generation circuit 108, the comparator 109 outputs a low-level voltage, and the switch elements 101 and 102 shift into the above-described first state. As a result, the voltage of the output node n101 rises. On the other hand, if the output of the error amplifier 104 is smaller than the output voltage of the ramp wave generation circuit 108, the comparator 109 outputs a high-level voltage, and the switch elements 101 and 102 shift into the above-described second state. As a result, the voltage of the output node n101 drops. In this manner, the voltage of the output node n101 remains equal to a constant value.

As shown in FIG. 6B, the step-up DC/DC converter 110 includes a switch element 111, which is a N-channel MOS transistor; a switch element 112, which is a P-channel MOS transistor; a choke coil 113; an error amplifier 114; a reference voltage generation circuit 115; a variable resistor 116; a resistor 117; a ramp wave generation circuit 118; and a comparator 119. To an input node n110 of the step-up DC/DC converter 110, a DC power supply 120 is connected. To an output node n111, a load 122 is connected.

The choke coil 113 and the switch element 112 are connected in series in this order between the input node n110 and the output node n111. The switch element 111 is connected between a node n112, which is a connection point of the choke coil 113 and the switch element 112, and a ground terminal. The resistor 117 and the variable resistor 116 are connected in series in this order between the output node n111 and a node n113, which is a ground-side end of the switch element 111.

Gate electrodes of the switch elements 111 and 112 are connected to an output terminal of the comparator 119. A non-inverting input terminal of the comparator 119 is connected to an output terminal of the ramp wave generation circuit 118. An inverting input terminal of the comparator 119 is connected to an output terminal of the error amplifier 114. A non-inverting input terminal of the error amplifier 114 is connected to the reference voltage generation circuit 115. An inverting input terminal of the error amplifier 114 is connected to a node n114, which is a connection point of the resistor 117 and the variable resistor 116.

In the step-up DC/DC converter 110, under the control of the error amplifier 114, the state of the switch elements 111 and 112 is switched. More specifically, between a third state in which the switch elements 111 and 112 are ON and OFF, respectively, and a fourth state in which the switch elements 111 and 112 are OFF and ON, respectively, the state of the switch elements 111 and 112 is switched. In the third state, the power-supply voltage is supplied along a route R103 from the DC power supply 120 to the choke coil 113, and energy is accumulated in the choke coil 113. In the fourth state, the power-supply voltage is supplied along a route R104 from the DC power supply 120 to the load 122. However, a voltage generated from the energy released from the choke coil 113 is added. Therefore, the voltage that is applied to the load 122 is greater than the power-supply voltage output from the DC power supply 120.

The error amplifier 114 outputs a value obtained by integrating the difference between the voltage of the node n114 and an output voltage of the reference voltage generation circuit 115. If the integration value is larger than the output voltage of the ramp wave generation circuit 118, the comparator 119 outputs a high-level voltage, and the switch elements 111 and 112 shift into the above-described third state. As a result, energy is accumulated in the choke coil 113, and the voltage of the output node n111 drops. On the other hand, if the output of the error amplifier 114 is smaller than the output voltage of the ramp wave generation circuit 118, the comparator 119 outputs a low-level voltage, and the switch elements 111 and 112 shift into the above-described fourth state. As a result, the voltage of the output node n111 rises. In this manner, the voltage of the output node n111 remains equal to a constant value.

The following describes problems with the case where a plurality of non-isolated DC/DC converters are integrated in one electronic-component built-in substrate.

First, the following description will focus on the step-down DC/DC converter 100. As can be seen from the above description, the error amplifier 104 controls the switching of the switch elements 101 and 102 based on the voltage of the node n104. The voltage of the node n104 varies according not only to the voltage of the node n101 but to the voltage of the node n103. Therefore, in order for the error amplifier 104 to properly operate, the voltage of the node n103 needs to be kept at a constant level.

As shown in FIG. 6A, the node n103 is connected to the ground terminal. Accordingly, the voltage of the node n103 is usually equal to a ground potential that is supplied from outside. In fact, if current flows through the route R101 (and current does not flow through the node n103), the voltage of the node n103 is substantially equal to the ground potential. However, if current flows through the route R102, the voltage of the node n103 becomes smaller than the ground potential. The reason is that the voltage drops due to the existence of wiring resistance between the node n103 and the ground terminal.

If only one non-isolated DC/DC converter is incorporated into one electronic-component built-in substrate, the internal wiring and internal via conductors of the electronic-component built-in substrate can be designed in such a way as to make the wiring resistance between the node n103 and the ground terminal as small as possible. In this manner, the above-described drop in the voltage of the node n103 can be lowered to an almost non-problematic level. However, if a plurality of non-isolated DC/DC converters are integrated in one electronic-component built-in substrate, the design flexibility of the internal wiring and internal via conductors of the electronic-component built-in substrate is significantly limited. Therefore, it is difficult to lower the drop in the voltage of the node n103 by improving the design. As a result, an error in the step-down operation becomes larger.

The same is true for the step-up DC/DC converter 110. In the step-up DC/DC converter 110, in order for the error amplifier 114 to properly operate, the voltage of the node n113 needs to be kept at a constant level. However, if a plurality of non-isolated DC/DC converters are integrated in one electronic-component built-in substrate, the design flexibility of the internal wiring and internal via conductors of the electronic-component built-in substrate is significantly limited. Therefore, it is difficult to lower an increase in the voltage of the node n113 (or an increase caused by the current flowing through the route R103) by improving the design. As a result, an error in the step-up operation can become larger.

SUMMARY

Therefore, one of the objects of the present invention is to provide a complex power management device and communication device that can increase the accuracy of operation of each of a plurality of non-isolated DC/DC converters that are integrated in one electronic-component built-in substrate.

A complex power management device of the present invention includes: a plurality of non-isolated DC/DC converters that each have a first node to which external power is supplied, and a second node which is connected to a load, and a ground terminal to which ground potential is supplied; and a common reference line that is connected in common to the plurality of non-isolated DC/DC converters, wherein each of the plurality of non-isolated DC/DC converters includes a first switch element and inductor, which are connected in series between the first node and the second node, a second switch element, one end of which is connected to a third node that is a connection point of the first switch element and the inductor and the other end of which is connected to the corresponding ground terminal, and an output voltage adjustment circuit, which exclusively controls an ON/OFF state of the first and second switch elements based on a voltage of a fourth node that is the other end of the second switch element, and the common reference line is connected to a fifth node that is provided on a wire connecting the second switch element of each of the plurality of non-isolated DC/DC converters to the ground terminal.

Therefore, the present invention can prevent a drop in voltage of the fourth node when the non-isolated DC/DC converters are of a step-down type, or a rise in voltage of the fourth node when the non-isolated DC/DC converters are of a step-up type. Thus, the present invention can improve the accuracy of operation of each of the plurality of non-isolated DC/DC converters integrated in one electronic-component built-in substrate. Moreover, the present invention can achieve the effect of reducing ripple noise that emerges at the second node, and the effect of reducing high-frequency resonance noise that emerges immediately after the first and second switch elements are switched ON or OFF.

The above complex power management device may further include: a multilayer substrate that includes first to third wiring layers, a first resin layer that is located between the first wiring layer and the second wiring layer, a second resin layer that is located between the second wiring layer and the third wiring layer, a first via conductor that passes through the first resin layer to connect the first and second wiring layers together, a second via conductor that passes through the second resin layer to connect the second and third wiring layers together, and an IC via conductor that is provided on the second resin layer; a semiconductor electronic component in which the first and second switch elements of each of the plurality of non-isolated DC/DC converters and the output voltage adjustment circuit are integrated and which is embedded in the second resin layer, wherein the ground terminal of each of the plurality of non-isolated DC/DC converters is formed on the first wiring layer and is connected to the second and third wiring layers via the first and second via conductors, the semiconductor electronic component is connected, via the IC via conductor, to a wire inside the second wiring layer that is connected to the corresponding ground terminal, the common reference line is provided on the third wiring layer, and the ground terminal of each of the plurality of non-isolated DC/DC converters is connected to a wire that is the common reference line inside the third wiring layer.

In the above complex power management device, the multilayer substrate may further include a fourth wiring layer, a third resin layer that is located between the third wiring layer and the fourth wiring layer, and a third via conductor that passes through the third resin layer to connect the third and fourth wiring layers together, and the inductor may be a chip component connected to the fourth wiring layer.

Furthermore, each of the plurality of non-isolated DC/DC converters includes a first capacitor that is connected between the first node and the common reference line, and a second capacitor that is connected between the second node and the common reference line, and the first and second capacitors may be chip components connected to the fourth wiring layer.

Furthermore, in each of the above complex power management devices, if a ratio of a first voltage, which is a voltage of the fourth node when the common reference line does not exist, in each of the plurality of non-isolated DC/DC converters to a total of the first voltages of the plurality of non-isolated DC/DC converters is referred to as a first ratio, and if a ratio of a first resistance value, which is of wiring resistance between the fifth node and the common reference line, in each of the plurality of non-isolated DC/DC converters to a total of the first resistance values of the plurality of non-isolated DC/DC converters is referred to as a second ratio, the first resistance value of each of the plurality of non-isolated DC/DC converters may be determined in such a way that the first and second ratios in the non-isolated DC/DC converters are inversely proportional to each other.

Furthermore, in each of the above complex power management devices, each of the plurality of non-isolated DC/DC converters includes a current sensor that measures an amount of current flowing between the fourth node and the fifth node, the complex power management device further includes transfer function correction means correcting a transfer function of the output voltage adjustment circuit of each of the plurality of non-isolated DC/DC converters; and storage means storing correction information of the transfer function for each of the plurality of non-isolated DC/DC converters, and the transfer function correction means may correct the transfer function of the output voltage adjustment circuit of each of the plurality of non-isolated DC/DC converters based on a result of measurement by the current sensor of each of the plurality of non-isolated DC/DC converters and the correction information stored in the storage means.

Furthermore, in each of the above complex power management devices, each of the plurality of non-isolated DC/DC converters is a step-down DC/DC converter, and the first switch element may be electrically placed closer to the first node than the inductor; or each of the plurality of non-isolated DC/DC converters is a step-up DC/DC converter, and the first switch element may be electrically placed closer to the second node than the inductor.

A communication device of the present invention includes one of the above complex power management devices.

According to the present invention, it is possible to increase the accuracy of operation of each of a plurality of non-isolated DC/DC converters that are integrated in one electronic-component built-in substrate.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1A:
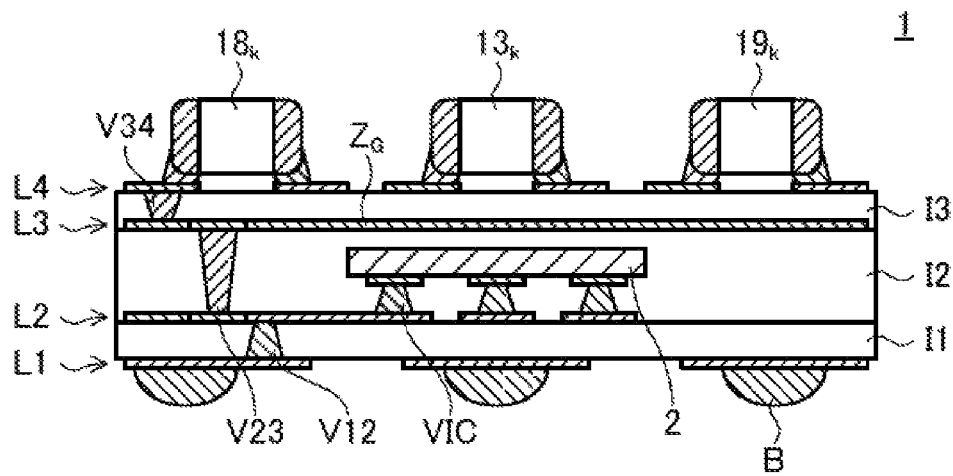
FIG. 1A is a schematic cross-sectional view of a complex power management device 1 according to a preferred first embodiment of the present invention.
Figure 1B:
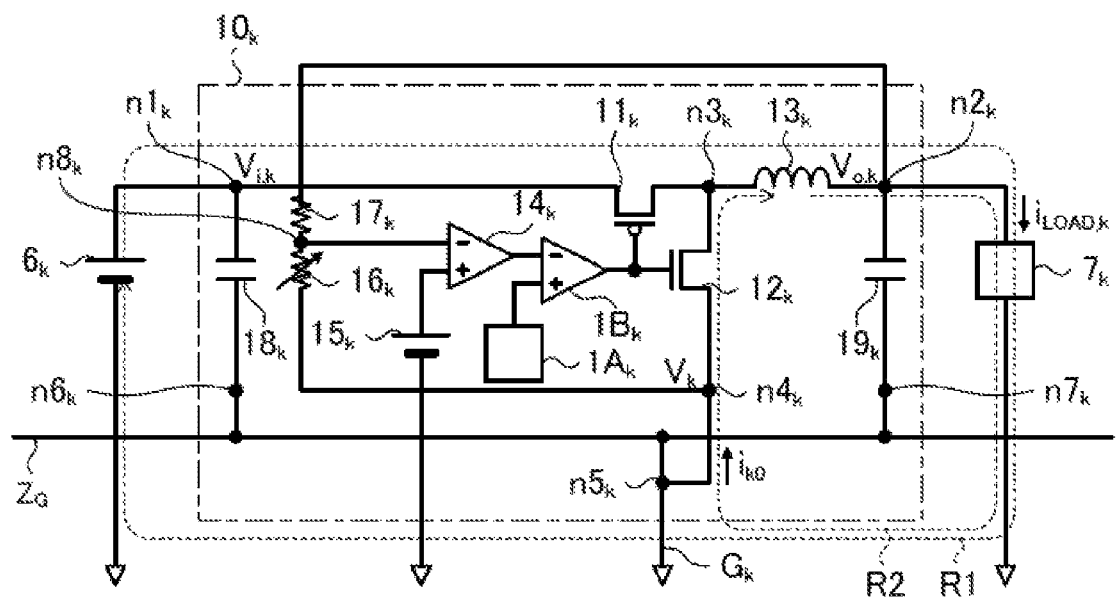
FIG. 1B is a diagram showing the circuit configuration of a DC/DC converter $10_k$ incorporated in the complex power management device 1.

FIG. 1A is a schematic cross-sectional view of a complex power management device 1 according to a preferred first embodiment of the present invention. FIG. 1B is a diagram showing the circuit configuration of a DC/DC converter $10_k$ incorporated in the complex power management device 1. The DC/DC converter $10_k$ is a non-isolated step-down DC/DC converter. The complex power management device 1 contains n+1 DC/DC converters $10_k$ (DC/DC converters $10_0$ to $10_n$).

As shown in FIG. 1A, the complex power management device 1 has a structure in which a semiconductor electronic component 2 is embedded in a multilayer substrate consisting of three resin layers I1 to I3. The semiconductor electronic component 2 constitutes a semiconductor circuit (or a circuit containing switch elements $11_k$ and $12_k$, an error amplifier $14_k$, and the like as described later) that the DC/DC converters $10_0$ to $10_n$ contain. The semiconductor electronic component 2 is embedded in the resin layer I2 in such a way that a terminal surface thereof faces the resin layer I1.

On a lower surface of the resin layer I1 that constitutes a lower surface of the multilayer substrate, a wiring layer L1 and solder balls B are formed. When the complex power management device 1 is mounted on an external printed circuit board or the like, the solder balls B are used to connect a wire on the printed circuit board to a terminal of the complex power management device 1.

Between the resin layer I1 and the resin layer I2, a wiring layer L2 is formed. Between the resin layer I2 and the resin layer I3, a wiring layer L3 is formed. The wires that are formed as the wiring layer L3 include a common reference line $Z_G$, which will be described later in detail.

On an upper surface of the resin layer I3 that constitutes an upper surface of the multilayer substrate, a wiring layer L4 is formed. On a surface of the wiring layer L4, the following chip components are mounted: primary-side capacitors $18_0$ to $18_n$, choke coils $13_0$ to $13_n$, and secondary-side capacitors $19_0$ to $19_n$. Incidentally, FIG. 1A shows only one primary-side capacitor $18_k$, one choke coil $13_k$, and one secondary-side capacitor $19_k$.

Via conductors V12, V23, and V34 are provided in the resin layers I1, I2, and I3, respectively. The via conductor V12 passes through the resin layer I1, and connects the wiring layer L1 to the wiring layer L2. The via conductor V23 passes through the resin layer I2, and connects the wiring layer L2 to the wiring layer L3. The via conductor V34 passes through the resin layer I3, and connects the wiring layer L3 to the wiring layer L4. In the resin layer I2, IC via conductors VIC are also provided. The IC via conductors VIC connect the wiring layer L2 to terminal electrodes of the semiconductor electronic component 2.

As shown in FIG. 1B, the DC/DC converter $10_k$ includes a switch element $11_k$, which is a P-channel MOS transistor; a switch element $12_k$, which is a N-channel MOS transistor; a choke coil $13_k$; an error amplifier $14_k$ (output voltage adjustment circuit); a reference voltage generation circuit $15_k$; a variable resistor $16_k$; a resistor $17_k$; a primary-side capacitor $18_k$; a secondary-side capacitor $19_k$; a ramp wave generation circuit $1A_k$; and a comparator $1B_k$. To an input node $n1_k$ of the DC/DC converter $10_k$, a DC power supply $6_k$ is connected. To an output node $n2k$, a load $7_k$ is connected. Incidentally, the same DC power supply $6_k$ may be used for some or all of the DC/DC converters $10_0$ to $10_n$.

The switch element $11_k$ and the choke coil $13_k$ are connected in series in this order between the input node $n1_k$ and the output node $n2_k$. The switch element $12_k$ is connected between a node $n3_k$, which is a connection point of the switch element $11_k$ and the choke coil $13_k$, and a ground terminal $G_k$, which is one of the solder balls B shown in FIG. 1A. The resistor $17_k$ and the variable resistor $16_k$ are connected in series in this order between the output node $n2_k$ and a node $n4_k$, which is a ground-side end of the switch element $12_k$.

To the ground terminal $G_k$, not only is the switch element $12_k$ (node $n4_k$) connected, but also a node $n6_k$, which is a ground-side end of the primary-side capacitor $18_k$, and a node $n7_k$, which is a ground-side end of the secondary-side capacitor $19_k$, are connected. That is, the ground terminal $G_k$ is a common ground terminal to the switch element $12_k$, the primary-side capacitor $18_k$, and the secondary-side capacitor $19_k$. The other end of the primary-side capacitor $18_k$ is connected to the input node $n1_k$. The other end of the secondary-side capacitor $19_k$ is connected to the output node $n2_k$.

The nodes $n6_k$ and $n7_k$ and the ground terminal $G_k$ are connected together via the common reference line $Z_G$ that belongs to the wiring layer L3 shown in FIG. 1A. In the middle of a wire connecting the common reference line $Z_G$ and the ground terminal $G_k$, a node $n5_k$ is provided. The node $n4_k$ is connected to the ground terminal $G_k$ via the node $n5_k$.

The common reference line $Z_G$ is common to the DC converters $10_0$ to $10_n$. That is, the common reference line $Z_G$ is connected to the nodes $n5_0$ to $n5_n$ (nodes $n4$ to $n4_n$ and ground terminals $G_0$ to $G_n$), nodes $n6_0$ to $n6_n$, and nodes $n7_0$ to $n7_n$.

Gate electrodes of the switch elements $11_k$ and $12_k$ are connected to an output terminal of the comparator $1B_k$. A non-inverting input terminal of the comparator $1B_k$ is connected to an output terminal of the ramp wave generation circuit $1A_k$. An inverting input terminal of the comparator $1B_k$ is connected to an output terminal of the error amplifier $14_k$. A non-inverting input terminal of the error amplifier $14_k$ is connected to the reference voltage generation circuit $15_k$. An inverting input terminal of the error amplifier $14_k$ is connected to a node $n8_k$, which is a connection point of the resistor $17_k$ and the variable resistor $16_k$.

In the DC/DC converter $10_k$, under the control of the error amplifier $14_k$, the state of the switch elements $11_k$ and $12_k$ is exclusively switched. More specifically, between a first state in which the switch elements $11_k$ and $12_k$ are respectively ON and OFF (A period during which the switch elements $11_k$ and $12_k$ are in the first state will be referred to as an "ON period"), and a second state in which the switch elements $11_k$ and $12_k$ are respectively OFF and ON (A period during which the switch elements $11_k$ and $12_k$ are in the second state will be referred to as an "OFF period"), the state of the switch elements $11_k$ and $12_k$ is switched. During the ON period, a power-supply voltage is supplied along a route R1 from the DC power supply $6_k$ to the load $7_k$, and energy is accumulated in the choke coil $13_k$. During the OFF period, a voltage is generated from the energy released from the choke coil $13_k$, and the voltage is supplied along a route R2 to the load $7_k$.

The error amplifier $14_k$ outputs a value obtained by integrating the difference between the voltage of the node $n8_k$ and an output voltage of the reference voltage generation circuit $15_k$. If the integration value is larger than the output voltage of the ramp wave generation circuit $1A_k$, the comparator $1B_k$ outputs a low-level voltage, and the switch elements $11_k$ and $12_k$ shift into the above-described first state. As a result, the voltage of the output node $n2_k$ rises. On the other hand, if the output of the error amplifier $14_k$ is smaller than the output voltage of the ramp wave generation circuit $1A_k$, the comparator $1B_k$ outputs a high-level voltage, and the switch elements $11_k$ and $12_k$ shift into the above-described second state. As a result, the voltage of the output node $n2_k$ drops. In this manner, the voltage of the output node $n2_k$ remains equal to a constant value.

Figure 2A:
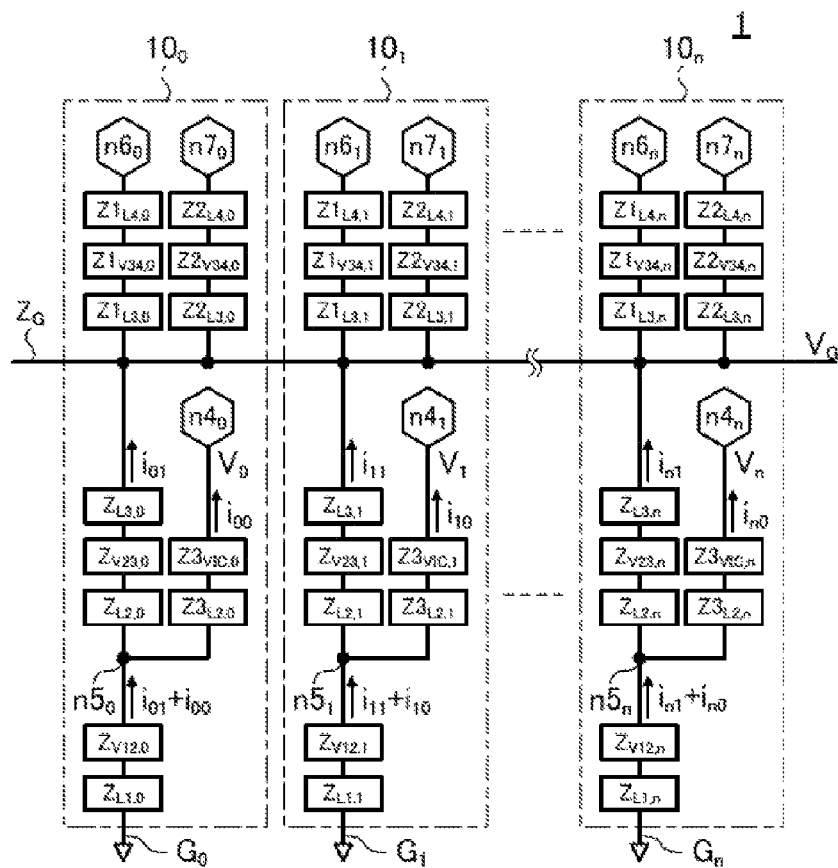
FIG. 2A is a diagram showing impedance of wires that connect the nodes $n4_k$, $n6_k$, and $n7_k$, the common reference line $Z_G$, and the ground terminal $G_k$ in regard to the complex power management device 1.

FIG. 2A is a diagram showing impedance of wires that connect the nodes $n4_k$, $n6_k$, and $n7_k$, the common reference line $Z_G$, and the ground terminal $G_k$. The impedance $Z_{x,k}$ (x is L1, V12, L2, V23, or L3) shown in FIG. 2A represents the impedance of a portion that is formed as a wiring layer or via conductor indicated by variable x, out of wires connecting ground terminals $G_k$ and the common reference line $Z_G$. As can be seen from the diagram, the nodes $n5_k$ are provided on the wiring layer L2. The impedance $Z1_{x,k}$ (x is L4, V34, or L3) represents the impedance of a portion that is formed as a wiring layer or via conductor indicated by variable x, out of wires connecting the common reference line $Z_G$ and nodes $n6_k$. The impedance $Z2_{x,k}$ (x is L4, V34, or L3) represents the impedance of a portion that is formed as a wiring layer or via conductor indicated by variable x, out of wires connecting the common reference line $Z_G$ and nodes $n7_k$. The impedance $Z3_{x,k}$ (x is L2 or VIC) represents the impedance of a portion that is formed as a wiring layer or via conductor indicated by variable x, out of wires connecting nodes $n5_k$ and nodes $n4_k$.

Current $i_{k0}$ is the current flowing into the nodes $n4_k$ from the nodes $n5_k$ during the OFF period. Current $i_{k1}$ is the current flowing into the common reference line $Z_G$ from the nodes $n5_k$ during the OFF period.

The current $i_{k0}$ is represented by the following formula (1) by using current $i_{LOAD,k}$ flowing into the load $7_k$, and on-duty D (Time ratio=ON-period duration/cycle) of the switch element $11_k$. Incidentally, $V_{i,k}$ and $V_{o,k}$ on the third side of the equation (1) are voltages of the nodes $n1_k$ and $n2_k$, respectively (See FIG. 1B).

$$i_{k0} = i_{LOAD,k} \cdot (1 - D) = i_{LOAD,k} \cdot \left(1 - \frac{V_{o,k}}{V_{i,k}}\right) \tag{1}$$

Current $i_{k1}$ is represented by the following formula (2). In the formula (2), $Z_{A,k}$ is the impedance ($=Z_{L1,k}+Z_{V12,k}$) between the nodes $n5_k$ and the ground terminals $G_k$; $Z_{B,k}$ is the impedance ($=Z_{L2,k}+Z_{V23,k}+Z_{L3,k}$) between the nodes $n5_k$ and the common reference line $Z_G$. Moreover, A is a constant, which is represented by the formula (3); M, L, and j are defined by the formulae (4) to (6).

$$i_{k1} = \frac{1}{A}\left[\sum_{m=0,m\neq k}^{n}\left\{Z_{A,m} \cdot \prod_{j=m+1,j\neq k}^{M}(Z_{A,j}+Z_{B,j}) \cdot i_{j0}\right\} - \sum_{m=0,m\neq k}^{n}(Z_{A,m}+Z_{B,m})\cdot Z_{A,k} \cdot i_{k0}\right] \tag{2}$$

$$A = \sum_{k=0}^{n}\left(\prod_{j=1}^{M}Z_{A,j}\right) + \sum_{k=0}^{n}\left(\prod_{j=1}^{M}Z_{B,j}\right) + \sum_{k=0}^{n}\left(Z_{A,m}\cdot\prod_{j=m+1}^{L}Z_{B,j}\right) + \sum_{k=0}^{n}\left(Z_{B,m}\cdot\prod_{j=m+1}^{L}Z_{B,j}\right) \tag{3}$$

$$\begin{cases} M = n - 1 + m & (m \leq 1) \\ M = m - 2 & (m > 1) \end{cases} \tag{4}$$

$$\begin{cases} L = n + m & (m = 1) \\ L = m - 1 & (m \geq 1) \end{cases} \tag{5}$$

$$\begin{cases} j = m, m+1, m+2, \ldots, M & (m \leq 1) \\ j = m, m+1, m+2, \ldots n, 0, \ldots, M & (m > 1) \end{cases} \tag{6}$$

Ideally, it is preferred that the voltage $V_k$ of the node $n4_k$ be equal to the ground potential. However, during the OFF period, the above currents $i_{k0}$ and $i_{k1}$ flow. Accordingly, a drop in voltage occurs at the impedance $Z_{Li,k}$, $Z_{V12,k}$, $Z3_{L2,k}$, and $Z3_{VIC,k}$ that exist between the ground terminals $G_k$ and the nodes $n4_k$. As a result, the voltage $V_k$ drops below the ground potential. In the complex power management device 1 of the present embodiment, the common reference line $Z_G$ is used to connect the nodes $n5_0$ to $n5_n$ together. Therefore, the change in the voltage $V_k$ is curbed. Thus, compared with the case where no common reference line $Z_G$ is used, the accuracy of the step-down operation can be improved.

Figure 2B:
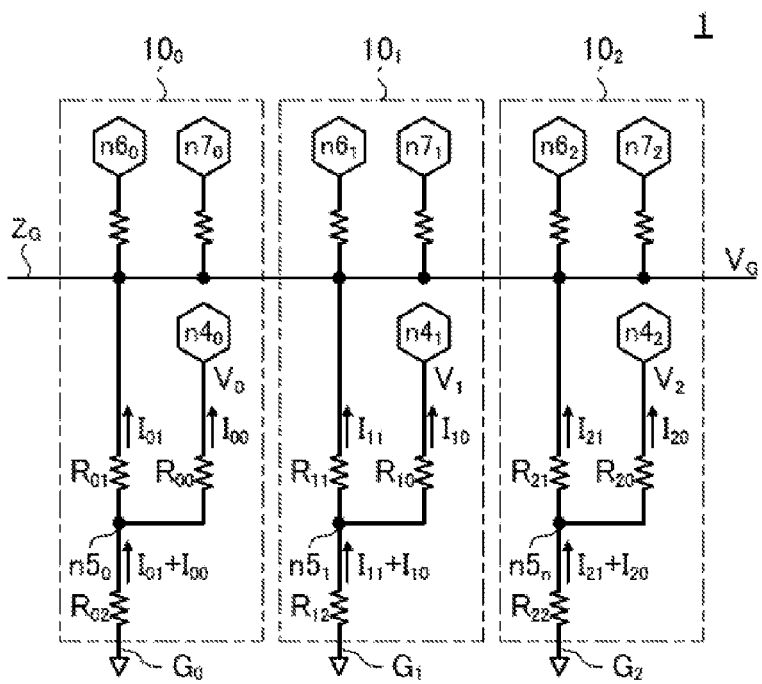
FIG. 2B is a diagram showing a case in which n=2.

Hereinafter, the reason why the above advantageous effects can be achieved by the complex power management device 1 will be described in detail. However, if the configuration of FIG. 2A is used for the following description, formulae and the like will become complex. Therefore, the following description uses an example in which n=2 (or when the complex power management device 1 is made up of three DC/DC converters $10_0$ to $10_2$), as shown in FIG. 2B. Moreover, the description will focus only on DC components. Each impedance will be explained by replacing the impedance $Z3_{VIC,k}$ and $Z3_{V2,k}$ with combined resistance $R_{k0}$, the impedance $Z_{L3,k}$, $Z_{V23,k}$, and $Z_{L2,k}$ with combined resistance $R_{k1}$, and the impedance $Z_{V12,k}$ and $Z_{Li,k}$ with combined resistance $R_{k2}$.

First, take a look at a steady state in which currents $I_{00} \sim I_{20}$ remain unchanged. In the steady state, current does not flow through the capacitors $18_k$ and $19_k$ (nodes $n6_k$ and $n7_k$). Therefore, the following formula (7) holds between currents $I_{01}$ to $I_{21}$, which flow into the common reference line $Z_G$ from the ground terminals $G_0$ to $G_2$.

$$I_{01}+I_{11}+I_{21}=0 \tag{7}$$

If the distribution of voltage within the common reference line $Z_G$ is constant, the voltage $V_G$ of the common reference line $Z_G$ is represented by the following formula (8).

$$V_G = R_{01}I_{01} + R_{02}(I_{01} + I_{00}) \tag{8}$$
$$= R_{11}I_{11} + R_{12}(I_{11} + I_{10})$$
$$= R_{21}I_{21} + R_{22}(I_{21} + I_{20})$$

From the formula (7), current $I_{21}$ is calculated and then substituted into the fourth side of the equation (8). As a result, based on the relationship with the second side of the equation (8), the following formula (9) is obtained.

$$(R_{01} + R_{02} + R_{21} + R_{22})I_{01} + (R_{21} + R_{22})I_{11} = R_{22}I_{20} - R_{02}I_{00} \tag{9}$$

From the first and second sides of the equation (8), the following formula (10) is obtained.

$$(R_{01}+R_{02})I_{01}-(R_{11}+R_{12})I_{11}=R_{12}I_{10}-R_{02}I_{00} \tag{10}$$

By regarding the formulae (9) and (10) as simultaneous equations of currents $I_{01}$ and $I_{11}$, it is possible to express each of currents $I_{01}$ and $I_{11}$ with a function of currents $I_{00}$ to $I_{20}$, as shown in the following formulae (11) and (12). Similarly, current $I_{21}$ can be expressed by a function of currents $I_{00}$ to $I_{20}$, as shown in the following formula (13). However, B in the formulae (11) to (13) is a constant, which is represented by the formula (14). Incidentally, the formulae (11) to (13) correspond to the above formula (2).

$$I_{01} = \frac{1}{B}\{R_{12}(R_{21} + R_{22})I_{10} + R_{22}(R_{11} + R_{12})I_{20} - R_{02}(R_{11} + R_{12} + R_{21} + R_{22})I_{00}\} \tag{11}$$

$$I_{11} = \frac{1}{B}\{R_{02}(R_{21} + R_{22})I_{00} + R_{22}(R_{01} + R_{02})I_{20} - R_{12}(R_{01} + R_{02} + R_{21} + R_{22})I_{10}\} \tag{12}$$

-continued $$I_{21} = \frac{1}{B}\{R_{02}(R_{11}+R_{12})I_{00} + \\ R_{12}(R_{01}+R_{02})I_{10} - R_{22}(R_{01}+R_{02}+R_{11}+R_{12})I_{20}\} \quad (13)$$

$$B = R_{01}R_{11} + R_{11}R_{21} + R_{21}R_{01} + \\ R_{01}R_{12} + R_{11}R_{22} + R_{21}R_{02} + \\ R_{02}R_{11} + R_{12}R_{21} + R_{22}R_{01} + \\ R_{02}R_{12} + R_{12}R_{22} + R_{22}R_{02} \quad (14)$$

The use of the formulae (11) to (13) makes it possible to express voltages $V_0$ to $V_2$ with a function of currents $I_{00}$ to $I_{20}$, as shown in the following formulae (15) to (17).

$$V_0 = 0 - \{R_{02}(I_{01}+I_{00}) + R_{00}I_{00}\} \quad (15)$$
$$= -\frac{R_{02}}{B}\{R_{12}(R_{21}+R_{22})I_{10} + R_{22}(R_{11}+R_{12})I_{20} - \\ R_{02}(R_{11}+R_{12}+R_{21}+R_{22})I_{00}\} - \\ (R_{02}+R_{00})I_{00}$$

$$V_1 = 0 - \{R_{12}(I_{11}+I_{10}) + R_{10}I_{10}\} \quad (16)$$
$$= -\frac{R_{12}}{B}\{R_{02}(R_{21}+R_{22})I_{00} + R_{22}(R_{01}+R_{02})I_{20} - \\ R_{12}(R_{01}+R_{02}+R_{21}+R_{22})I_{10}\} - \\ (R_{12}+R_{10})I_{10}$$

$$V_2 = 0 - \{R_{22}(I_{21}+I_{20}) + R_{20}I_{20}\} \quad (17)$$
$$= -\frac{R_{22}}{B}\{R_{02}(R_{11}+R_{12})I_{00} + R_{12}(R_{01}+R_{02})I_{10} - \\ R_{22}(R_{01}+R_{02}+R_{11}+R_{12})I_{20}\} - \\ (R_{22}+R_{20})I_{20}$$

If the common reference line $Z_G$ is not used, the voltages $V_{0B}$ to $V_{2B}$ of the nodes $n4_0$ to $n4_2$ are represented by the following formulae (18) to (20), as can be seen from FIG. 2B.

$$V_{0B} = -(R_{02}+R_{00})I_{00} \quad (18)$$

$$V_{1B} = -(R_{12}+R_{10})I_{10} \quad (19)$$

$$V_{2B} = -(R_{22}+R_{20})I_{20} \quad (20)$$

Based on the formulae (15) to (20), the differences $D_0$ to $D_2$ in voltage of the nodes $n4_0$ to $n4_2$ between when the common reference line $Z_G$ is used and when the common reference line $Z_G$ is not used are represented by the following formulae (21) to (23).

$$D_0 = -\frac{R_{02}}{B}\{R_{12}(R_{21}+R_{22})I_{10} + \\ R_{22}(R_{11}+R_{12})I_{20} - R_{02}(R_{11}+R_{12}+R_{21}+R_{22})I_{00}\} \quad (21)$$

$$D_1 = -\frac{R_{12}}{B}\{R_{02}(R_{21}+R_{22})I_{00} + \\ R_{22}(R_{01}+R_{02})I_{20} - R_{12}(R_{01}+R_{02}+R_{21}+R_{22})I_{10}\} \quad (22)$$

$$D_2 = -\frac{R_{22}}{B}\{R_{02}(R_{11}+R_{12})I_{00} + \\ R_{12}(R_{01}+R_{02})I_{10} - R_{22}(R_{01}+R_{02}+R_{11}+R_{12})I_{20}\} \quad (23)$$

As can be seen from the formula (18), the voltage $V_{0B}$ is in a monotonic-decrease relationship with the current $I_{00}$. On the other hand, as can be seen from the formula (21), the difference $D_0$ is in a monotonic-increase relationship with the current $I_{00}$. Accordingly, a decrease in the voltage $V_{0B}$ caused by the current flowing through the route R2 shown in FIG. 1A is cancelled by an increase in the difference $D_0$, thereby meaning that a drop in voltage of the node $n4_0$ caused by the current flowing through the route R2 is curbed. Therefore, the accuracy of the voltage supplied to the inverting input terminal of the error amplifier $14_0$ is improved. The same is true of the error amplifiers $14_1$ and $14_2$. Therefore, in the complex power management device 1, compared with the case where no common reference line $Z_G$ is used, the accuracy of the step-down operation is improved.

The following provides a more detailed description by focusing on the case where $R_{02}=R_{12}=R_{22}=R_1$ and $R_{01}=R_{11}=R_{21}=R_2$. In this case, the formulae (21) to (23) are transformed into the following formulae (24) to (26).

$$D_0 = \\ -\frac{R_1}{B}\{R_1(R_2+R_1)I_{10} + R_1(R_2+R_1)I_{20} - R_1(2R_2+2R_1)I_{00}\} \quad (24)$$

$$D_1 = \\ -\frac{R_1}{B}\{R_1(R_2+R_1)I_{00} + R_1(R_2+R_1)I_{20} - R_1(2R_2+2R_1)I_{10}\} \quad (25)$$

$$D_2 = \\ -\frac{R_1}{B}\{R_1(R_2+R_1)I_{00} + R_1(R_2+R_1)I_{10} - R_1(2R_2+2R_1)I_{20}\} \quad (26)$$

If the difference $D_0$ is set to zero and then the formula (24) is transformed, the current $I_{00}$ at a time when the difference $D_0$ is equal to zero can be calculated as shown in the following formula (27).

$$I_{00} = \frac{I_{00}+I_{10}+I_{20}}{3} \quad (27)$$

The right side of the equation (27) is an average value of currents $I_{00}$ to $I_{20}$. That is, the difference $D_0$ is equal to zero when the current $I_{00}$ is equal to the average value of currents $I_{00}$ to $I_{20}$, and, at this time, the voltage $V_0$ is equal to the voltage $V_{0B}$. If the current $I_{00}$ is shifted in a direction in which the current $I_{00}$ becomes smaller than the average value of currents $I_{00}$ to $I_{20}$, the difference $D_0$ becomes a negative value. As can be seen from the formula (18), the voltage $V_{0B}$ at this time is shifted in a direction in which the voltage $V_{0B}$ becomes larger as the current $I_{00}$ is changed. Therefore, the difference $D_0$ that is a negative value works in a direction to cancel the change of the voltage $V_{0B}$. If the current $I_{00}$ is shifted in a direction in which the current $I_{00}$ becomes larger than the average value of currents $I_{00}$ to $I_{20}$, the difference $D_0$ takes a positive value. As can be seen from the formula (18), the voltage $V_{0B}$ at this time is shifted in a direction in which the voltage $V_{0B}$ becomes smaller as the current $I_{00}$ is changed. Therefore, the difference $D_0$ that is a positive value works in a direction to cancel the change of the voltage $V_{0B}$.

In that manner, the change in the difference $D_0$ caused by the change in the current $I_{00}$ works in a direction to cancel the change in the voltage $V_{0B}$. Therefore, in the complex power management device 1, as described above, compared with the case where no common reference line $Z_G$ is used, a drop in the voltage of the node $n4_0$ caused by the current flowing through the route R2 is curbed. The same is true of the nodes $n4_1$ and $n4_2$.

As described above, the complex power management device 1 of the present embodiment can improve the accuracy of the step-down operation.

Incidentally, the specific value of resistance value $R_{k1}$ is preferably determined in such a way that the ratio of $R_{k1}$ to the resistance values $R_{01}$ to $R_{n1}$ combined $(=R_{k1}/(R_{01}+\ldots+R_{n1}))$ is inversely proportional to the ratio of $V_{kB}$ to the combined voltages $V_{0B}$ to $V_{nB}$ of the nodes $n4_0$ to $n4_n$ at a time when no common reference line $Z_G$ is used. In the above-described example in which n=2, the resistance values $R_{01}$ to $R_{21}$ thus determined satisfy the following formulae (28) to (30).

$$\frac{R_{01}}{R_{01}+R_{11}+R_{21}} = \frac{1}{\left(\frac{V_{0B}}{V_{0B}+V_{1B}+V_{2B}}\right)} \quad (28)$$

$$\frac{R_{11}}{R_{01}+R_{11}+R_{21}} = \frac{1}{\left(\frac{V_{1B}}{V_{0B}+V_{1B}+V_{2B}}\right)} \quad (29)$$

$$\frac{R_{21}}{R_{01}+R_{11}+R_{21}} = \frac{1}{\left(\frac{V_{2B}}{V_{0B}+V_{1B}+V_{2B}}\right)} \quad (30)$$

The resistance values $R_{01}$ to $R_{21}$ are determined in such a way as to satisfy the formulae (28) to (30). Accordingly, a change in the voltages $V_0$ to $V_2$ caused by a change in the currents $I_{00}$ to $I_{20}$ can be appropriately curbed. This point will be described in detail by using the voltage $V_0$ as an example.

Given the formula (28), it is clear that, as the ratio of $V_{0B}$ to $V_{0B}+V_{1B}+V_{2B}$ increases, a change in the difference $D_0$ caused by a change in the current $I_{00}$ becomes larger. That is, given the formula (28), as the ratio of $V_{0B}$ to $V_{0B}+V_{1B}+V_{2B}$ increases, the ratio of $R_{01}$ to $R_{01}+R_{11}+R_{21}$ becomes smaller. As a result, the ratio of $R_{11}+R_{21}$ to $R_{01}+R_{11}+R_{21}$ becomes larger, and the third term $(=R_{02}(R_{11}+R_{12}+R_{21}+R_{22})+I_{00})$ inside the "{ }" on the right side of the equation (15) becomes larger. Accordingly, the change in the difference $D_0$ caused by the change in the current $I_{00}$ becomes larger.

Meanwhile, as can be seen from the formula (18), the change in the voltage $V_{0B}$ caused by the change in the current $I_{00}$ becomes larger as the ratio of $V_{0B}$ to $V_{0B}+V_{1B}+V_{2B}$ increases (i.e. as $R_{02}+R_{00}$ becomes larger). To cancel that large change, the change in the difference $D_0$ needs to be increased. As described above, given the formula (28), the change in the difference $D_0$ is increased, thereby making it possible to cancel the large change in the voltage $V_{0B}$ and to appropriately curb the change in the voltage $V_0$.

Incidentally, in general, the impedance $Z_{L3,k}$ and $Z_{V23,k}$ are preferably determined in such a way as to satisfy the following formula (31). In this case, if the current $i_{k0}$ of each DC/DC converter $10_k$ is larger than that of other DC/DC converters $10_k$, the DC/DC converter $10_k$ can curb the amount of current $(=i_{k0})$ that is drawn from a corresponding ground terminal $G_k$, and can receive the current $(=i_{k1})$ distributed from the other DC/DC converters $10_k$ (or from the ground terminals $G_K$ corresponding to the other DC/DC converters $10_k$) via the common reference line $Z_G$. If the current $i_{k0}$ of each DC/DC converter $10_k$ is smaller than that of other DC/DC converters $10_k$, the DC/DC converter $10_k$ can distribute, to the other DC/DC converters $10_k$ via the common reference line $Z_G$, part of the current $(=i_{k0})$ that is drawn into the node $n4_k$ from a corresponding ground terminal $G_k$. Therefore, each DC/DC converter $10_k$ is able to appropriately curb the change in the voltage $V_k$.

$$\frac{Z_{L3,k}+Z_{V23,k}}{\sum_{m=0}^{n}(Z_{L3,m}+Z_{V23,m})} = \frac{1}{\dfrac{(Z_{L1,k}+Z_{V12,k}+Z_{L2,k}+Z_{VIC,k})\times i_{k0}}{\sum_{m=0}^{n}\left[\begin{array}{c}(Z_{L1,m}+Z_{V12,m}+\\ Z_{L2,m}+Z_{VIC,m})\times i_{m0}\end{array}\right]}} \quad (31)$$

The complex power management device 1 of the present embodiment may make the voltage value of the node $n4_k$ as close to the ground voltage as possible by correcting a control convergence point of a transfer function that is implemented in the error amplifier $14_k$ based on the voltage of the node $n4_k$. In such a case, the accuracy of the step-down operation can be further improved.

In addition to the above-described advantageous effects, the complex power management device 1 of the present embodiment can achieve the following advantageous effects: the effect of reducing ripple noises that emerge in the output voltage (or voltage of the output node $n2_k$); and the effect of reducing high-frequency resonance noises that emerge immediately after the switch elements $11_k$ and $12_k$ are switched ON or OFF. Hereinafter, those advantageous effects will be detailed. Incidentally, in the following description, first an example of a complex power management device that does not use the common reference line $Z_G$ will be described as a comparative example to present a general description of ripple noises and high-frequency resonance noises. After that, the advantageous effects achieved by the complex power management device 1 of the present embodiment will be described in comparison with the comparative example.

Figure 3A:
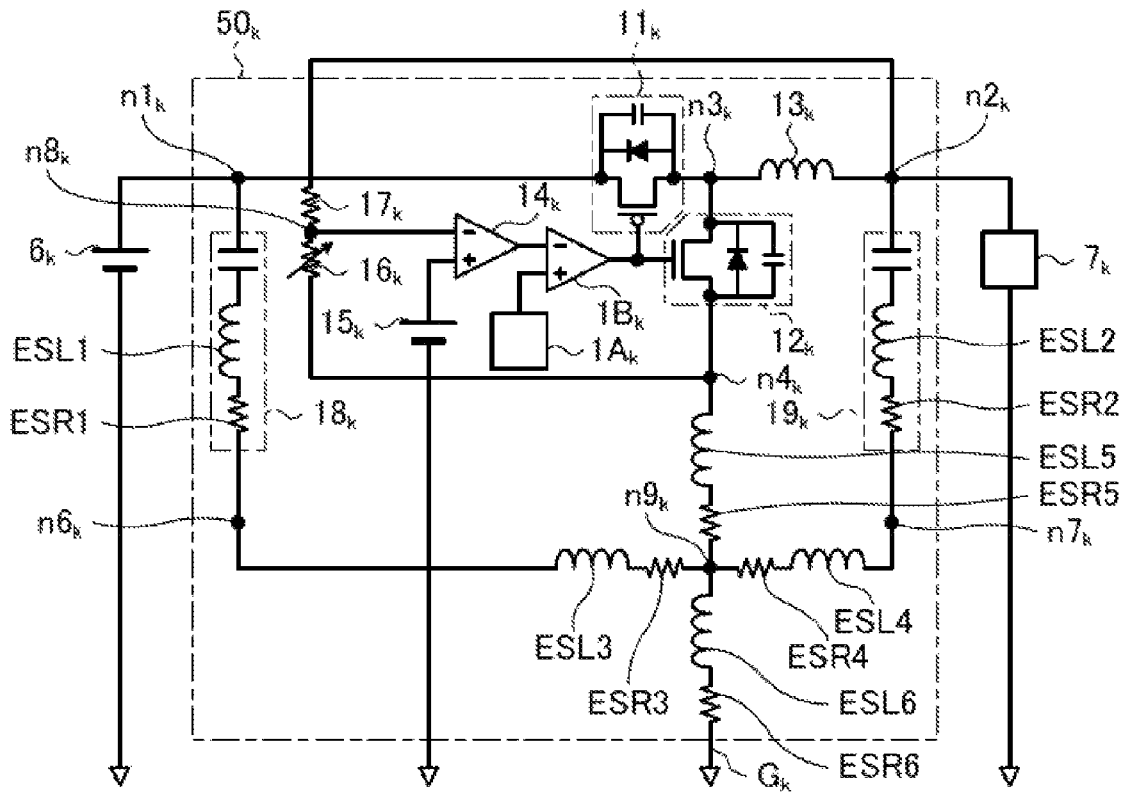
FIG. 3A is a diagram showing the circuit configuration of a DC/DC converter $50_k$ included in a complex power management device according to a comparative example of the present invention.

FIG. 3A is a diagram showing the circuit configuration of a DC/DC converter $50_k$ included in a complex power management device according to a comparative example of the present invention. The DC/DC converter $50_k$ shown in FIG. 3A has the same configuration as the above DC/DC converter $10_k$ has except that the common reference line $Z_G$ is not used. A node $n4_k$, which is a ground-side end of a switch element $12_k$, a node $n6_k$, which is a ground-side end of a primary-side capacitor $18_k$, and a node $n7_k$, which is a ground-side end of a secondary-side capacitor $19_k$, are connected together at a node $n9_k$. The node $n9_k$ is connected to a ground terminal $G_k$. The nodes $n4_k$, $n6_k$, and $n7_k$ are connected to the ground terminal $G_k$ via the node $n9_k$.

FIG. 3A explicitly shows parasitic inductance ESL1 and parasitic resistance ESR1 of the primary-side capacitor $18_k$; parasitic inductance ESL2 and parasitic resistance ESR2 of the secondary-side capacitor $19_k$; parasitic inductance ESL3 and parasitic resistance ESR3 between the node $n6_k$ and the node $n9_k$; parasitic inductance ESL4 and parasitic resistance ESR4 between the node $n7_k$ and the node $n9_k$; parasitic inductance ESL5 and parasitic resistance ESR5 between the node $n4_k$ and the node $n9_k$; and parasitic inductance ESL6 and parasitic resistance ESR6 between the node $n9_k$ and the ground terminal $G_k$. Moreover, as for the switch element $11_k$ and the switch element $12_k$, parasitic diodes and equivalent capacitors are explicitly shown.

Figure 3B:
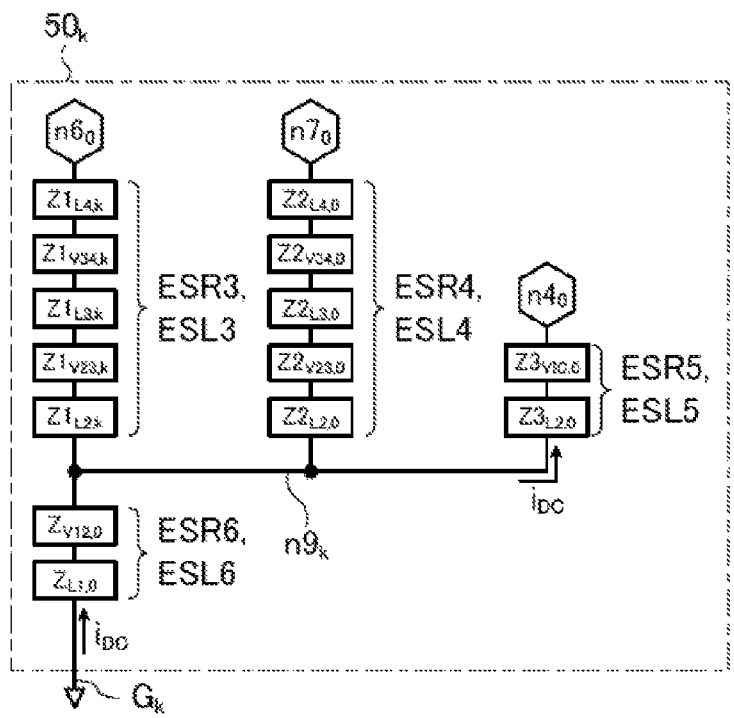
FIG. 3B is a diagram showing impedance of wires connecting the nodes $n4_k$, $n6_k$, and $n7_k$ and the ground terminal $G_k$ in regard to the DC/DC converter $50_k$.

FIG. 3B is a diagram showing impedance of wires connecting the nodes $n4_k$, $n6_k$, and $n7_k$ and the ground terminal $G_k$. The meanings of symbols of impedance shown in FIG. 3B are the same as those in FIG. 2A. As shown in FIG. 3B, the magnitude of the parasitic inductance ESL3 and parasitic resistance ESR3 is determined based on the impedance $Z1_{L4,k}$ of a wiring layer L4, the impedance $Z1_{V34,k}$ of a via conductor V34, the impedance $Z1_{L3,k}$ of a wiring layer L3, the impedance $Z1_{V23,k}$ of a via conductor V23, and the impedance $Z1_{L3,k}$ of a wiring layer L2. More specifically, each can be expressed by the following formulae (32) and (33).

$$ESL3 = +\Im(Z1_{L4,k}) + \Im(Z1_{V34,k}) + \Im(Z1_{L3,k}) + \Im(Z1_{V23,k}) + \Im(Z1_{L2,k}) \tag{32}$$

$$ESR3 = \Re(Z1_{L4,k}) + \Re(Z1_{V34,k}) + \Re(Z1_{L3,k}) + \Re(Z1_{V23,k}) + \Re(Z1_{L2,k}) \tag{33}$$

Similarly, the other parasitic inductance and parasitic resistance can be expressed by the following formulae (34) to (39).

$$ESL4 = +\Im(Z2_{L4,k}) + \Im(Z2_{V34,k}) + \Im(Z2_{L3,k}) + \Im(Z2_{V23,k}) + \Im(Z2_{L2,k}) \tag{34}$$

$$ESR3 = \Re(Z2_{L4,k}) + \Re(Z2_{V34,k}) + \Re(Z2_{L3,k}) + \Re(Z2_{V23,k}) + \Re(Z2_{L2,k}) \tag{35}$$

$$ESL5 = \Im(Z3_{VTC,k}) + \Im(Z3_{L2,k}) \tag{36}$$

$$ESR5 = \Re(Z3_{VTC,k}) + \Re(Z3_{L2,k}) \tag{37}$$

$$ESL6 = \Im(Z_{V12,k}) + \Im(Z_{L1,k}) \tag{38}$$

$$ESR6 = \Re(Z_{V12,k}) + \Re(Z_{L1,k}) \tag{39}$$

Ripple noise $\Delta V_{o,k}(t)$ in the DC/DC converter $50_k$ is represented by the following formula (40); $v_C(t)$, $v_{ESR}(t)$, and $v_{ESL}(t)$ in the formula (40) are expressed by the formulae (41) to (43). In the formulae (41) to (43), $C_{D2}$ is capacitance of the secondary-side capacitor $19_k$, and $I_L(t)$ is the current flowing through a choke coil $13_k$.

$$\Delta V_{o,k}(t) = v_C(t) + v_R(t) + v_L(t) \tag{40}$$

$$v_C(t) = \frac{1}{C_{D2}} \int I_L(t) dt \tag{41}$$

$$v_R(t) = (ESR2 + ESR4 + ESR6) \cdot I_L(t) \tag{42}$$

$$v_L(t) = (ESL2 + ESL4 + ESL6) \cdot \frac{d I_L(t)}{dt} \tag{43}$$

In the complex power management device 1 of the present embodiment, among capacitive component $v_C(t)$, resistance component $v_R(t)$, and inductance component $v_L(t)$, two of them, resistance component $v_R(t)$ and inductance component $v_L(t)$, are reduced. This point will be described in detail.

First, a method of calculating $I_L(t)$ in the DC/DC converter $50_k$ will be described. A state equation of the DC/DC converter $50_k$ is represented by the following formula (44): $I_{o,k}$ is the current flowing through the output node $n2_k$, and L is the inductance of the choke coil $13_k$. R and C represent the resistance component and capacitive component of the circuit, respectively. D is on-duty of the above switch element $11_k$. If the on-resistance of the switch element $11_k$ is equal to the on-resistance of the switch element $12_k$, Rs is obtained by adding a DC resistance component of the choke coil $13_k$ to that on-resistance.

$$\begin{pmatrix} \frac{d}{dt} I_{o,k} \\ \frac{d}{dt} V_{o,k} \end{pmatrix} = \begin{pmatrix} -\frac{Rs}{L} & -\frac{1}{L} \\ \frac{1}{C} & -\frac{1}{CR} \end{pmatrix} \begin{pmatrix} I_{o,k} \\ V_{o,k} \end{pmatrix} + D \begin{pmatrix} \frac{1}{L} \\ 0 \end{pmatrix} V_{i,k} \tag{44}$$

Rs can be regarded as equal to zero. In the steady state in which time derivatives of $V_{o,k}$ and $I_{o,k}$ (See the left side of the equation (44)) are all equal to zero, the relationship of the following formulae (45) and (46) can be obtained from the equation (44).

$$D = \frac{V_{o,k}}{V_{i,k}} \tag{45}$$

$$I_{i,k} = \frac{D}{R} V_{i,k} \tag{46}$$

By using the formula (45), it is possible to calculate $I_{Lon}(t)$, which is the current $I_L(t)$ during the ON period, and $I_{Loff}(t)$, which is the current $I_L(t)$ during the OFF period, as shown in the following formulae (47) and (48). However, $T_{off}$ and $T_{on}$ represent duration of the OFF and ON periods, respectively.

$$I_{Lon}(t) = \int \frac{V_{i,k} - V_{o,k}}{L} dt = \int \frac{1-D}{L} V_{i,k} dt = \frac{1-D}{L} V_{i,k} T_{on} \tag{47}$$

$$I_{Loff}(t) = \int \frac{-V_{o,k}}{L} dt = \int \frac{-D}{L} V_{i,k} dt = -\frac{D}{L} V_{i,k} T_{off} \tag{48}$$

By substituting the formulae (47) and (48) into the formulae (42) and (43), as shown in the following formulae (49) to (52), it is possible to calculate: $v_{Ron}(t)$, which is an amount of voltage change, $v_R(t)$, caused by the resistance component during the ON period; $v_{Roff}(t)$, which is an amount of voltage change, $v_R(t)$, caused by the resistance component during the OFF period; $v_{Lon}(t)$, which is an amount of voltage change, $v_L(t)$, caused by the inductance component during the ON period; and $v_{Loff}(t)$, which is an amount of voltage change, $v_L(t)$, caused by the inductance component during the OFF period.

$$v_{Ron}(t) = (ESR2 + ESR4 + ESR6) \cdot I_{Lon}(t) = \tag{49}$$
$$(ESR2 + ESR4 + ESR6) \frac{1-D}{L} V_{i,k} T_{on}$$

$$v_{Roff}(t) = (ESR2 + ESR4 + ESR6) \cdot I_{Loff}(t) = \tag{50}$$
$$-(ESR2 + ESR4 + ESR6) \frac{D}{L} V_{i,k} T_{off}$$

$$v_{Lon}(t) = (ESL2 + ESL4 + ESL6) \cdot \frac{d I_{Lon}(t)}{dt} = \tag{51}$$
$$(ESL2 + ESL4 + ESL6) \frac{1-D}{L} V_{i,k}$$

$$v_{Loff}(t) = (ESL2 + ESL4 + ESL6) \cdot \frac{d I_{Loff}(t)}{dt} = \tag{52}$$
$$-(ESL2 + ESL4 + ESL6) \frac{D}{L} V_{i,k}$$

From the formulae (50), (35), and (39), fluctuation range $\Delta v_R$ of the resistance component $v_R(t)$ can be calculated as shown in the following formula (53). From the formulae (51), (52), (34), and (38), fluctuation range $\Delta v_L$ of the inductance component $v_L(t)$ can be calculated as shown in the following formula (54).

$$\Delta v_R = 0 - \left(-(ESR2 + ESR4 + ESR6) \frac{D}{L} V_i T_{off}\right) \tag{53}$$
$$= (ESR2 + ESR4 + ESR6) \frac{D}{L} V_i T_{off}$$
$$= (ESR2 + R(Z2_{L4,k}) + R(Z2_{V34,k}) + R(Z2_{L3,k}) + R(Z2_{V23,k}) + R(Z2_{L2,k}) + R(Z_{V12,k}) + R(Z_{L1,k})) \frac{D}{L} V_i T_{off}$$

-continued $$\Delta v_L = \left((ESL2 + ESL4 + ESL6)\frac{1-D}{L}V_i\right) - \quad (54)$$
$$\left(-(ESL2 + ESL4 + ESL6)\frac{D}{L}V_i\right)$$
$$= (ESL2 + ESL4 + ESL6)\frac{1}{L}V_i$$
$$= (ESL2 + \Im(Z2_{L4,k}) + \Im(Z2_{V34,k}) + \Im(Z2_{L3,k}) +$$
$$\Im(Z2_{V23,k}) + \Im(Z2_{L2,k}) + \Im(Z_{V12,k}) +$$
$$\Im(Z_{L1,k}))\frac{1}{L}V_i$$

The formulae (53) and (54) are for the DC/DC converter $50_k$. However, even in the DC/DC converter $10_k$ of the present embodiment, the fluctuation range $\Delta v_R$ of the resistance component $v_R(t)$ of the ripple noise $\Delta V_{o,k}(t)$, and the fluctuation range $\Delta v_L$ of the inductance component $v_L(t)$ can be similarly calculated. In this case, however, a contribution made by the impedance (which is depicted below the common reference line $Z_G$ in FIG. 2A) between the common reference line $Z_G$, which is connected in common to a plurality of ground terminals $G_0$ to $G_n$, and the ground terminals $G_0$ to $G_n$ to the ripple noise $\Delta V_{o,k}(t)$ is so small that the contribution is negligible. Therefore, the fluctuation ranges $\Delta v_R$ and $\Delta v_L$ in the DC/DC converter $10_k$ can be expressed by the following formulae (55) and (56).

$$\Delta v_R = (ESR2 + R(Z2_{L4,k}) + R(Z2_{V34,k}) + R(Z2_{L3,k}))\frac{D}{L}V_{i,k}T_{off} \quad (55)$$

$$\Delta v_L = (ESL2 + \Im(Z2_{L4,k}) + \Im(Z2_{V34,k}) + \Im(Z2_{L3,k}))\frac{1}{L}V_{i,k} \quad (56)$$

After a comparison is made between the formulae (53) and (55) and between the formulae (54) and (56), it becomes clear that, compared with the DC/DC converter $50_k$, the resistance component $v_R(t)$ and inductance component $v_L(t)$ of the ripple noise $\Delta V_{o,k}(t)$ in the DC/DC converter $10_k$ are reduced. Therefore, it can be said that, in the complex power management device 1, the ripple noise that emerges in the output voltage (or voltage of the output node $n2_k$) has been reduced.

The following describes the high-frequency resonance noise that emerges immediately after the switch elements $11_k$ and $12_k$ are switched ON or OFF in the DC/DC converter $50_k$. The noise is attributable to the resonance-triggered release of electric charge accumulated in the parasitic diode of the switch element $11_k$ or $12_k$. More specifically, when the switch element $11_k$ is ON, input voltage $V_{i,k}$ is applied in the reverse direction to the parasitic diode of the switch element $12_k$. Therefore, in the equivalent capacitor (capacitance=$C_{D2}$) of the parasitic diode of the switch element $12_k$, electric charge, $Q=C_{D2}V_{i,k}$, is accumulated. As soon as the switch element $11_k$ is turned OFF, resonance occurs between the equivalent capacitor and the inductor component (ESL1+ESL3+ESL5) of the primary-side circuit, and the electric charge accumulated in the equivalent capacitor is therefore released, and the electric charge is superimposed on the output voltage $V_{o,k}$ as high-frequency resonance noise. When the switch element $12_k$ is ON, input voltage $V_{i,k}$ is applied in the reverse direction to the parasitic diode of the switch element $11_k$. Therefore, in the equivalent capacitor (capacitance=$C_{D1}$) of the parasitic diode of the switch element $11_k$, electric charge, $Q=C_{D1}V_{i,k}$, is accumulated. As soon as the switch element $12_k$ is turned OFF, resonance occurs between the equivalent capacitor and the inductor component (ESL1+ESL3+ESL5) of the primary-side circuit, and the electric charge accumulated in the equivalent capacitor is therefore released, and the electric charge is superimposed on the output voltage $V_{o,k}$ as high-frequency resonance noise.

The power of the above high-frequency resonance noise is represented by the following formulae (57) and (58): $P_{Turn\_off}$ is the power of the high-frequency resonance noise that occurs immediately after the switch element $11_k$ is turned OFF; $P_{Turn\_on}$ is the power of the high-frequency resonance noise that occurs immediately after the switch element $11_k$ is turned ON. Moreover, $V_{Turn\_off}$ and $I_{Turn\_off}$ are the voltage and current of the high-frequency resonance noise, respectively, that occurs immediately after the switch element $11_k$ is turned OFF. $V_{Turn\_on}$ and $I_{Turn\_on}$ are the voltage and current of the high-frequency resonance noise, respectively, that occurs immediately after the switch element $11_k$ is turned ON.

$$P_{Turn_{off}} = \frac{1}{2}C_{D2}V_{Turn_{off}}^2 = \frac{1}{2}(ESL1 + ESL3 + ESL5)I^2 \quad (57)$$

$$P_{Turn\_on} = \frac{1}{2}C_{D1}V_{Turn\_on}^2 = \frac{1}{2}(ESL1 + ESL3 + ESL5)I^2 \quad (58)$$

Based on the formulae (57), (32), and (36), as shown in the following formula (59), $V_{Turn\_off}$ can be expressed. Similarly, based on the formulae (58), (32), and (36), as shown in the following formula (60), $V_{Turn\_on}$ can be expressed.

$$V_{Turn\_off} = I\sqrt{\frac{ESL1 + ESL3 + ESL5}{C_{D2}}} \quad (59)$$
$$= I\left[\frac{1}{C_{D2}}\{ESL1 + \Im(Z1_{L4,k}) + \Im(Z1_{V34,k}) + \Im(Z1_{L3,k}) +\right.$$
$$\Im(Z1_{V23,k}) + \Im(Z1_{L2,k}) + \Im(Z3_{VIC,k}) +$$
$$\left.\Im(Z3_{L2,k})\}\right]^{\frac{1}{2}}$$

$$V_{Turn\_on} = I\sqrt{\frac{ESL1 + ESL3 + ESL5}{C_{D1}}} \quad (60)$$
$$= I\left[\frac{1}{C_{D1}}\{ESL1 + \Im(Z1_{L4,k}) + \Im(Z1_{V34,k}) + \Im(Z1_{L3,k}) +\right.$$
$$\Im(Z1_{V23,k}) + \Im(Z1_{L2,k}) + \Im(Z3_{VIC,k}) +$$
$$\left.\Im(Z3_{L2,k})\}\right]^{\frac{1}{2}}$$

The formulae (59) and (60) are for the DC/DC converter $50_k$. However, even in the DC/DC converter $10_k$ of the present embodiment, voltages $V_{Turn\_off}$ and $V_{Turn\_on}$ of the high-frequency resonance noise that emerges immediately after the state of the switch element $11_k$ is changed can be similarly calculated. In this case, however, a contribution made by the impedance that exists closer to the primary-side capacitor $18_k$ than the common reference line $Z_G$, i.e. the parasitic inductance ESL1 of the primary-side capacitor $18_k$ and the impedance $Z1_{L4,k}$, $Z1_{V23,k}$, and $Z1_{L3,k}$ shown in FIG. 2A, to the high-frequency resonance noise is so small that the contribution is negligible. Therefore, the voltages of the high-frequency resonance noise in the DC/DC converter $10_k$ are represented by the following formulae (61) and (62).

$$V_{Turn\_off} = \quad (61)$$
$$I\left[\frac{1}{C_{D2}}\{\Im(Z_{L3,k}) + \Im(Z_{V23,k}) + \Im(Z_{L2,k}) + \Im(Z3_{VIC,k}) + \Im(Z3_{L2,k})\}\right]^{\frac{1}{2}}$$

-continued $$V_{Turn\_on} = \qquad (62)$$
$$I\left[\frac{1}{C_{D1}}\{\Im(Z_{L3,k}) + \Im(Z_{V23,k}) + \Im(Z_{L2,k}) + \Im(Z3_{VIC,k}) + \Im(Z3_{L2,k})\}\right]^{\frac{1}{2}}$$

After a comparison is made between the formulae (59) and (61) and between the formulae (60) and (62), it becomes clear that, compared with the DC/DC converter $50_k$, the voltage levels of the high-frequency resonance noise in the DC/DC converter $10_k$ are reduced. Therefore, it can be said that, in the complex power management device 1, the high-frequency resonance noise that emerges immediately after the switch elements $11_k$ and $12_k$ are switched ON or OFF has been reduced.

Figure 4A:
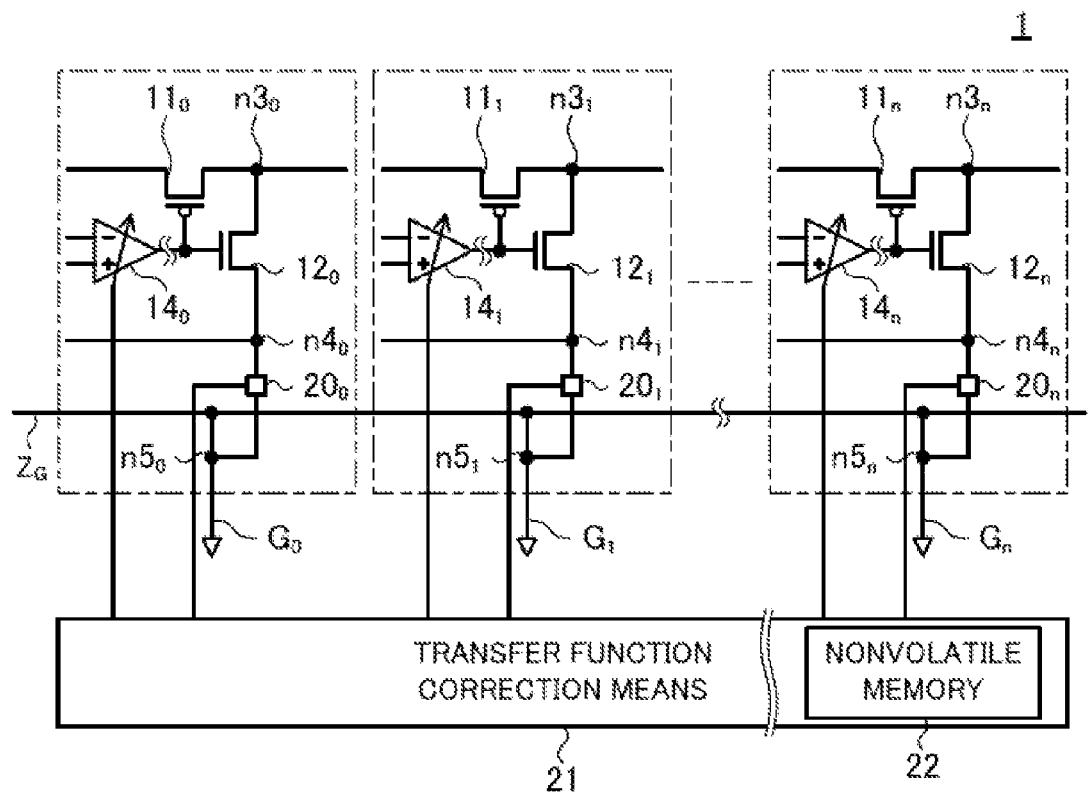
FIG. 4A is a diagram showing the circuit configuration of a complex power management device 1 according to a second embodiment of the present invention.

FIG. 4A is a diagram showing the circuit configuration of a complex power management device 1 according to a second embodiment of the present invention. This complex power management device 1 is different from the complex power management device 1 of the first embodiment in that a current sensor $20_k$ is provided for each of DC/DC converters $10_0$ to $10_n$, and that a transfer function correction means 21, which is common to the DC/DC converters $10_0$ to $10_n$, is provided. The rest of the configuration is the same. The following description focuses on the differences.

A current sensor $20_k$ is placed between a node $n4_k$ and a node $n5_k$; the current sensor $20_k$ measures an amount of current flowing through the current sensor $20_k$ (or the current $i_{k0}$ shown in FIG. 1B). The results of measurement by each current sensor $20_k$ are supplied to the transfer function correction means 21.

The transfer function correction means 21 includes a nonvolatile memory 22 (storage means). In the nonvolatile memory 22, correction information of the transfer function $f_k$ that is implemented in each error amplifier $14_k$ is written in advance.

Figure 4B:
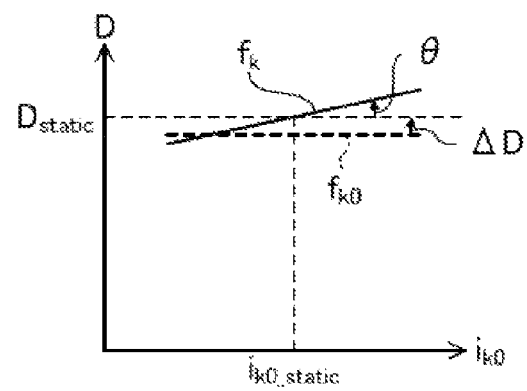
FIG. 4B is an explanatory diagram illustrating the correction information of the transfer function $f_k$.

FIG. 4B is an explanatory diagram illustrating the correction information of the transfer function $f_k$. In FIG. 4B, the horizontal axis represents the current $i_{k0}$, and the vertical axis represents on-duty D of the above switch element $11_k$. A transfer function $f_{k0}$ indicated by broken line is a transfer function $f_k$ before correction (or in initial state); the transfer function $f_{k0}$, as shown in FIG. 4B, is a constant that remains unchanged with respect to the current $i_{k0}$. The correction information includes information $\Delta D$, which is used to shift the transfer function $f_{k0}$ in the vertical-axis direction, and information $\theta$, which is used to change the slope. As shown in FIG. 4B, a transfer function $f_k$ that has been corrected based on the correction information is a straight line that has been shifted by $\Delta D$ in the vertical-axis direction from the transfer function $f_{k0}$; the slope of the straight line is $\theta$ relative to the horizontal axis.

The correction information $\Delta D$ is determined in such a way that the voltage of the node $n4_k$ in the steady state ($i_{k0}=i_{k0\_static}$) is equal to the ground voltage. In FIG. 4B, the value of the on-duty D in the steady state is represented as $D_{static}$. The correction information $\theta$ is determined in such a way as to minimize a change in voltage of the node $n4_k$ when the current $i_{k0}$ is shifted from the steady state.

The transfer function correction means 21 determines the on-duty D based on the transfer function $f_k$ that has been corrected as described above, and the amount of current that is input from the current sensor $20k$. Then, the transfer function correction means 21 controls the state of the switch elements $11_k$ and $12_k$ based on the on-duty D. Thus, the complex power management device 1 of the present embodiment can further improve the accuracy of the step-down operation.

Figure 5:
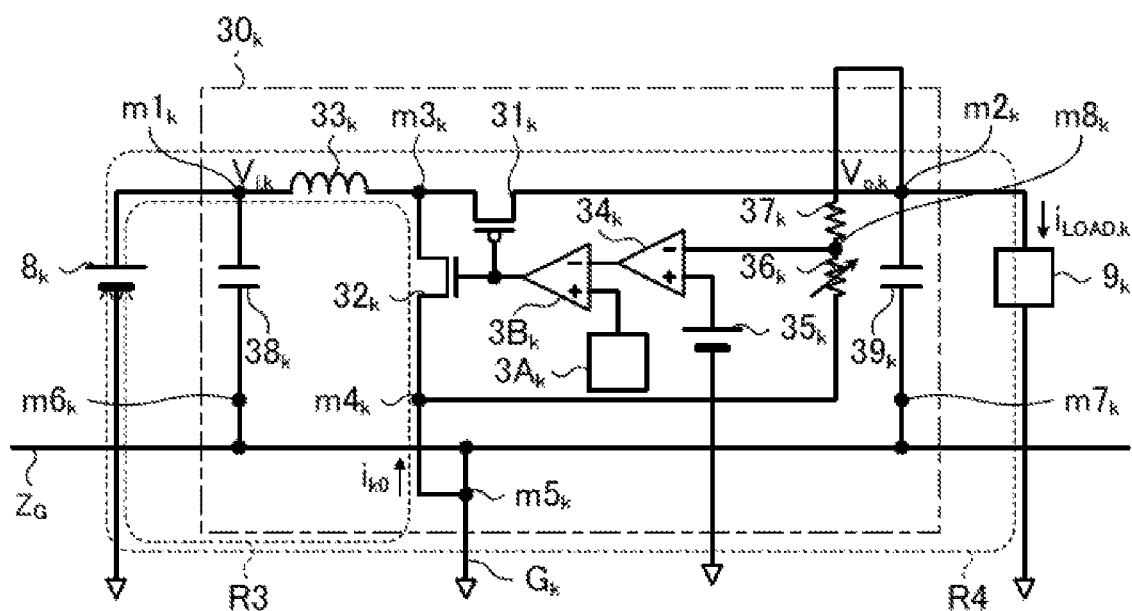
FIG. 5 is a diagram showing the circuit configuration of an non-isolated step-up DC/DC converter $30_k$ that is incorporated in a complex power management device according to a third embodiment of the present invention.
Figure 6A:
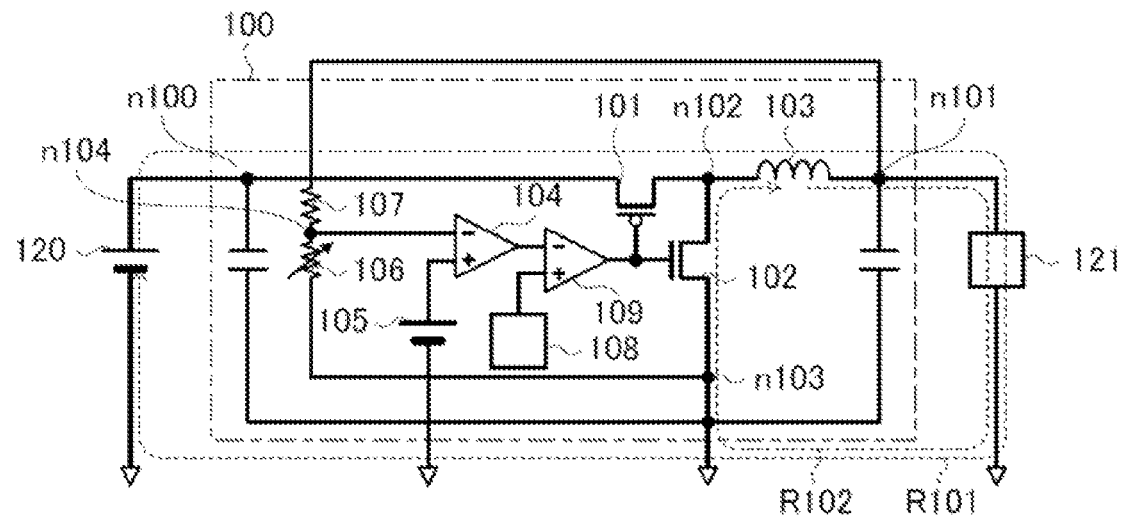
FIG. 6A is a diagram showing a non-isolated step-down DC/DC converter 100 according to background art of the present invention.
Figure 6B:
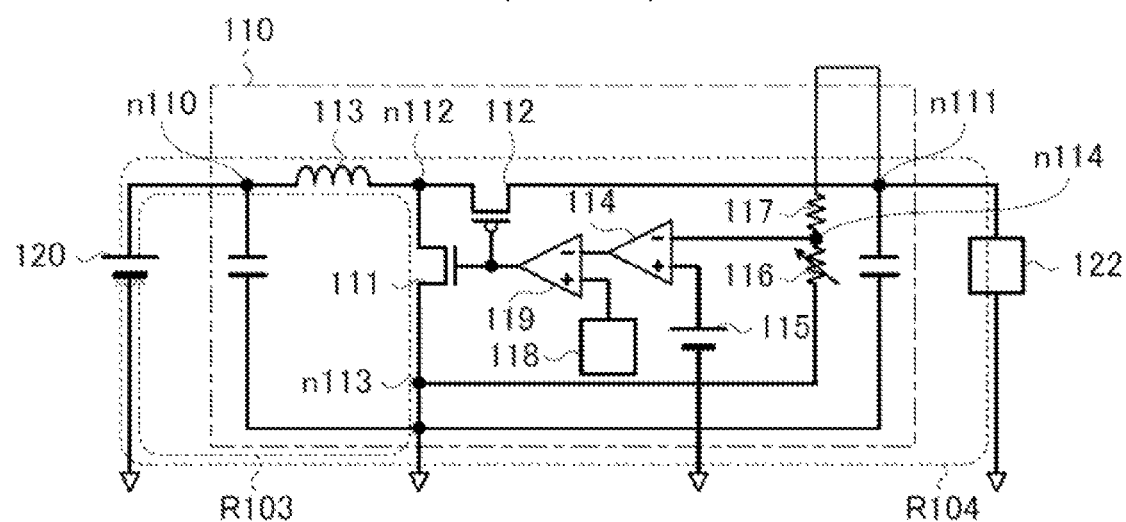
FIG. 6B is a diagram showing a non-isolated step-up DC/DC converter 110 according to background art of the present invention.

FIG. 5 is a diagram showing the circuit configuration of an non-isolated step-up DC/DC converter $30_k$ that is incorporated in a complex power management device according to a third embodiment of the present invention. The complex power management device of the present invention contains a plurality of DC/DC converters having the same configuration as that of the DC/DC converter $30_k$ shown in FIG. 5. The complex power management device of the present invention is different from the complex power management device of the first embodiment in that step-up DC/DC converters are provided instead of the step-down DC/DC converters. The following description focuses on the difference.

As shown in FIG. 5, the DC/DC converter $30_k$ includes a switch element $31_k$, which is a P-channel MOS transistor; a switch element $32_k$, which is a N-channel MOS transistor; a choke coil $33_k$; an error amplifier $34_k$ (output voltage adjustment circuit); a reference voltage generation circuit $35_k$; a variable resistor $36_k$; a resistor $37_k$; a primary-side capacitor $38_k$; a secondary-side capacitor $39_k$; a ramp wave generation circuit $3A_k$; and a comparator $3B_k$. To an input node $m1_k$ of the DC/DC converter $30_k$, a DC power supply $8_k$ is connected. To an output node $m2_k$, a load $9_k$ is connected.

The choke coil $33_k$ and the switch element $31_k$ are connected in series in this order between the input node $m1_k$ and the output node $m2_k$. The switch element $32_k$ is connected between a node $m3_k$, which is a connection point of the switch element $31_k$ and choke coil $33_k$, and a ground terminal $G_k$. The resistor $37_k$ and the variable resistor $36_k$ are connected in series in this order between the output node $m2_k$ and a node $m4_k$, which is a ground-side end of the switch element $32_k$.

To the ground terminal $G_k$, not only is the switch element $32_k$ (node $m4_k$) connected, but a node $m6_k$, which is a ground-side end of the primary-side capacitor $38_k$, and a node $m7_k$, which is a ground-side end of the secondary-side capacitor $39_k$, are connected. That is, the ground terminal $G_k$ is a common ground terminal to the switch element $32_k$, the primary-side capacitor $38_k$, and the secondary-side capacitor $39_k$. The other end of the primary-side capacitor $38_k$ is connected to the input node $m1_k$. The other end of the secondary-side capacitor $39_k$ is connected to the output node $m2_k$.

The nodes $m6_k$ and $m7_k$ and the ground terminal $G_k$ are connected via a common reference line $Z_G$. In the middle of a wire connecting the common reference line $Z_G$ to the ground terminal $G_k$, a node $m5_k$ is provided. The node $m4_k$ is connected to the ground terminal $G_k$ via the node $m5_k$.

The common reference line $Z_G$ is common to a plurality of DC/DC converters in the complex power management device. That is, the common reference line $Z_G$ is connected to the node $m5_k$ (the node $m4_k$ and the ground terminal $G_k$), node $m6_k$, and node $m7_k$ of each DC/DC converter.

Gate electrodes of the switch elements $31_k$ and $32_k$ are connected to an output terminal of the comparator $3B_k$. A non-inverting input terminal of the comparator $3B_k$ is connected to an output terminal of the ramp wave generation circuit $3A_k$. An inverting input terminal of the comparator $3B_k$ is connected to an output terminal of the error amplifier $34_k$. A non-inverting input terminal of the error amplifier $34_k$ is connected to the reference voltage generation circuit $35_k$. An inverting input terminal of the error amplifier $34_k$ is connected to a node $m8_k$, which is a connection point of the resistor $37_k$ and the variable resistor $36_k$.

In the DC/DC converter $30_k$, under the control of the error amplifier $34_k$, the state of the switch elements $31_k$ and $32_k$ is exclusively switched. More specifically, between a third state in which the switch elements $31_k$ and $32_k$ are respectively ON and OFF, and a fourth state in which the switch elements $31_k$ and $32_k$ are respectively OFF and ON, the state of the switch elements $31_k$ and $32_k$ is switched. In the third state, a power-supply voltage is supplied along a route R3 from the DC power supply $8_k$ to the choke coil $33_k$, and energy is therefore accumulated in the choke coil $33_k$. In the fourth state, the power-supply voltage is supplied along a route R4 from the DC power supply $8_k$ to the load $9_k$. However, a voltage generated from the energy released from the choke coil $33_k$ is added. Therefore, the voltage that is applied to the load $9_k$ is greater than the power-supply voltage output from the DC power supply $8_k$.

The error amplifier $34_k$ outputs a value obtained by integrating the difference between the voltage of the node $m8_k$ and an output voltage of the reference voltage generation circuit $35_k$. If the integration value is larger than the output voltage of the ramp wave generation circuit $3A_k$, the comparator $3B_k$ outputs a high-level voltage, and the switch elements $31_k$ and $32_k$ shift into the above-described third state. As a result, energy is accumulated in the choke coil $33_k$, and the voltage of the output node $m2_k$ drops. On the other hand, if the output of the error amplifier $34_k$ is smaller than the output voltage of the ramp wave generation circuit $3A_k$, the comparator $3B_k$ outputs a low-level voltage, and the switch elements $31_k$ and $32_k$ shift into the above-described fourth state. As a result, the voltage of the output node $m2_k$ rises. In this manner, the voltage of the output node $m2_k$ remains equal to a constant value.

According to the present embodiment, the current $i_{k0}$ (negative value) that flows into the node $m4_k$ from the node $m5_k$ when the switch elements $31_k$ and $32_k$ are in the above-described third state is represented by the following formula (63): $i_{LOAD,k}$ is the current flowing into the load $9_k$, D is on-duty (Time ratio=ON-period duration/cycle) of the switch element $31_k$, and η is efficiency of power conversion. Moreover, $V_{i,k}$ and $V_{o,k}$ are voltages of the nodes $m1_k$ and $m2_k$, respectively.

$$i_{k0} = -i_{LOAD,k} \cdot \frac{V_{o,k}}{\eta V_{i,k}}(1-D) = \\ -i_{LOAD,k} \cdot \frac{V_{o,k}}{\eta V_{i,k}}\left(1 - \frac{V_{o,k}}{V_{i,k}}\right) = -i_{LOAD,k} \cdot \frac{V_{o,k} - V_{i,k}}{\eta V_{i,k}} \quad (63)$$

As in the case of the complex power management device of the first embodiment, the common reference line $Z_G$ is used in the complex power management device of the present embodiment to connect the nodes $m5_k$ of the DC/DC converters $30_k$ together. Therefore, a rise in voltage of the node $m4_k$ resulting from the current flowing through the route R3 is curbed. Accordingly, the accuracy of the step-up operation can be improved.

Incidentally, even in the complex power management device of the present embodiment, the impedance $Z_{L3,k}$ and $Z_{V23,k}$ (or the impedance between the node $m5_k$ and the common reference line $Z_G$) is preferably determined in such a way as to satisfy the above formula (31). In this manner, if the current $i_{k0}$ (or an absolute value thereof) of each DC/DC converter $30_k$ is larger than that of other DC/DC converters $30_k$, the release of current ($=i_{k0}$) into a corresponding ground terminal $G_k$ is suppressed, and the surplus current ($=i_{k1}$) generated by the suppression can be dispersively released to the other DC/DC converters $30_k$ via the common reference line $Z_G$.

It is apparent that the present invention is not limited to the above embodiments, but may be modified and changed without departing from the scope and spirit of the invention.

What is claimed is:

1. A complex power management device comprising:
    a plurality of non-isolated DC/DC converters that each have a first node to which external power is supplied, and a second node which is connected to a load, and each of the plurality of non-isolated DC/DC converters having a separate ground terminal to which around potential is supplied; and
    a common reference line that is connected in common to the plurality of non-isolated DC/DC converters,
    each of the plurality of non-isolated DC/DC converters including:
        a first switch element and inductor, which are connected in series between the first node and the second node;
        a second switch element, one end of which is connected to a third node that is a connection point of the first switch element and the inductor and an other end of which is connected to the separate ground terminal;
        an output voltage adjustment circuit, which exclusively controls an ON/OFF state of the first and second switch elements based on a voltage of a fourth node that is the other end of the second switch element; and
        a fifth node, connected to the common reference line, and provided on a wire connecting the fourth node to the separate ground terminal,
    wherein the common reference line is coupled to the fifth node of each of the plurality of non-isolated DC/DC converters.

2. The complex power management device as claimed in claim 1 further comprising:
    a multilayer substrate that includes:
        a first wiring layer;
        a second wiring layer;
        a third wiring layer;
        a first resin layer that is located between the first wiring layer and the second wiring layer;
        a second resin layer that is located between the second wiring layer and the third wiring layer;
        a first via conductor that passes through the first resin layer to connect the first wiring layer and the second wiring layers together;
        a second via conductor that passes through the second resin layer to connect the second wiring layer and the third wiring layers together; and
        an IC via conductor that is provided in the second resin layer;
    a semiconductor electronic component in which the first and second switch elements and the output voltage adjustment circuit of each of the plurality of non-isolated DC/DC converters are integrated, the semiconductor electronic component being embedded in the second resin layer, wherein
    the ground terminal of each of the plurality of non-isolated DC/DC converters is formed on the first wiring layer and is connected to the second and third wiring layers via the first and second via conductors,
    the semiconductor electronic component is connected, via the IC via conductor, to a wire inside the second wiring layer that is connected to the corresponding ground terminal,
    the common reference line is provided on the third wiring layer, and the ground terminal of each of the plurality of non-isolated DC/DC converters is connected to a wire that is the common reference line inside the third wiring layer.

3. The complex power management device as claimed in claim 2, wherein
the multilayer substrate may further include:
a fourth wiring layer;
a third resin layer that is located between the third wiring layer and the fourth wiring layer; and
a third via conductor that passes through the third resin layer to connect the third and fourth wiring layers together, and
the inductor is a chip component connected to the fourth wiring layer.

4. The complex power management device as claimed in claim 3, wherein
each of the plurality of non-isolated DC/DC converters includes:
a first capacitor that is connected between the first node and the common reference line; and
a second capacitor that is connected between the second node and the common reference line, and
the first and second capacitors are chip components connected to the fourth wiring layer.

5. The complex power management device as claimed in claim 1, wherein if a ratio of a first voltage, which is induced in the fourth node when the common reference line does not exist, in each of the plurality of non-isolated DC/DC converters to a total of the first voltage of each of the plurality of non-isolated DC/DC converters is referred to as a first ratio, and if a ratio of a first resistance value, which is of wiring resistance between the fifth node and the common reference line, in each of the plurality of non-isolated DC/DC converters to a total of the first resistance values of the plurality of non-isolated DC/DC converters is referred to as a second ratio, the first resistance value of each of the plurality of non-isolated DC/DC converters is determined in such a way that the first and second ratios in the non-isolated DC/DC converters are inversely proportional to each other.

6. The complex power management device as claimed in claim 1, wherein
each of the plurality of non-isolated DC/DC converters includes a current sensor that measures an amount of current flowing between the fourth node and the fifth node,
the complex power management device further includes:
transfer function correction means correcting a transfer function of the output voltage adjustment circuit of each of the plurality of non-isolated DC/DC converters; and
storage means storing correction information of the transfer function for each of the plurality of non-isolated DC/DC converters, and the transfer function correction means corrects the transfer function of the output voltage adjustment circuit of each of the plurality of non-isolated DC/DC converters based on a result of measurement by the current sensor of each of the plurality of non-isolated DC/DC converters and the correction information stored in the storage means.

7. The complex power management device as claimed in claim 1, wherein
each of the plurality of non-isolated DC/DC converters is a step-down DC/DC converter, and
the first switch element is electrically placed closer to the first node than the inductor.

8. The complex power management device as claimed in claim 1, wherein
each of the plurality of non-isolated DC/DC converters is a step-up DC/DC converter, and
the first switch element is electrically placed closer to the second node than the inductor.

9. A communication device comprising a complex power management device,
the complex power management device comprising:
a plurality of non-isolated DC/DC converters that each have a first node to which external power is supplied, and a second node which is connected to a load, and each of the plurality of non-isolated DC/DC converters having a separate ground terminal to which ground potential is supplied; and
a common reference line that is connected in common to the plurality of non-isolated DC/DC converters,
each of the plurality of non-isolated DC/DC converters including:
a first switch element and inductor, which are connected in series between the first node and the second node;
a second switch element, one end of which is connected to a third node that is a connection point of the first switch element and the inductor and an other end of which is connected to the separate ground terminal;
an output voltage adjustment circuit, which exclusively controls an ON/OFF state of the first and second switch elements based on a voltage of a fourth node that is the other end of the second switch element; and
a fifth node, connected to the common reference line, and provided on a wire connecting the fourth node to the separate ground terminal,
wherein the common reference line is coupled to the fifth node of each of the plurality of non-isolated DC/DC converters.

* * * * *